United States Patent [19]

Lindmayer

[11] 4,431,599
[45] * Feb. 14, 1984

[54] METHOD FOR THE MELTING AND SOLIDIFICATION OF SILICON

[75] Inventor: Joseph Lindmayer, Bethesda, Md.

[73] Assignee: Semix Incorporated, Gaithersburg, Md.

[*] Notice: The portion of the term of this patent subsequent to May 17, 1998 has been disclaimed.

[21] Appl. No.: 334,184

[22] Filed: Dec. 24, 1981

Related U.S. Application Data

[63] Continuation of Ser. No. 916,544, Jun. 19, 1978, abandoned.

[51] Int. Cl.³ .............................................. C04B 35/60
[52] U.S. Cl. ..................................... 264/85; 164/66.1
[58] Field of Search .................... 164/66.1, 147.1, 493, 164/513; 264/85, 332, 326, 299

[56] References Cited

U.S. PATENT DOCUMENTS 4,256,681 3/1981 Lindmayer ............................ 264/85

FOREIGN PATENT DOCUMENTS 923495 4/1963 United Kingdom .

Primary Examiner—Gus T. Hampilos
Assistant Examiner—Peter B. Martine
Attorney, Agent, or Firm—Watson, Cole, Grindle & Watson

[57] ABSTRACT

A method and apparatus for the continuous melting of silicon for use in semiconductor devices, the method tending to reduce the time and expense associated with conventional melting and forming. The method for melting silicon comprises charging silicon into a melting vessel having a drain therein, heating the silicon in the vessel to a temperature above the melting point of silicon, and allowing the molten silicon to pass through the drain out of the vessel.

10 Claims, 1 Drawing Figure

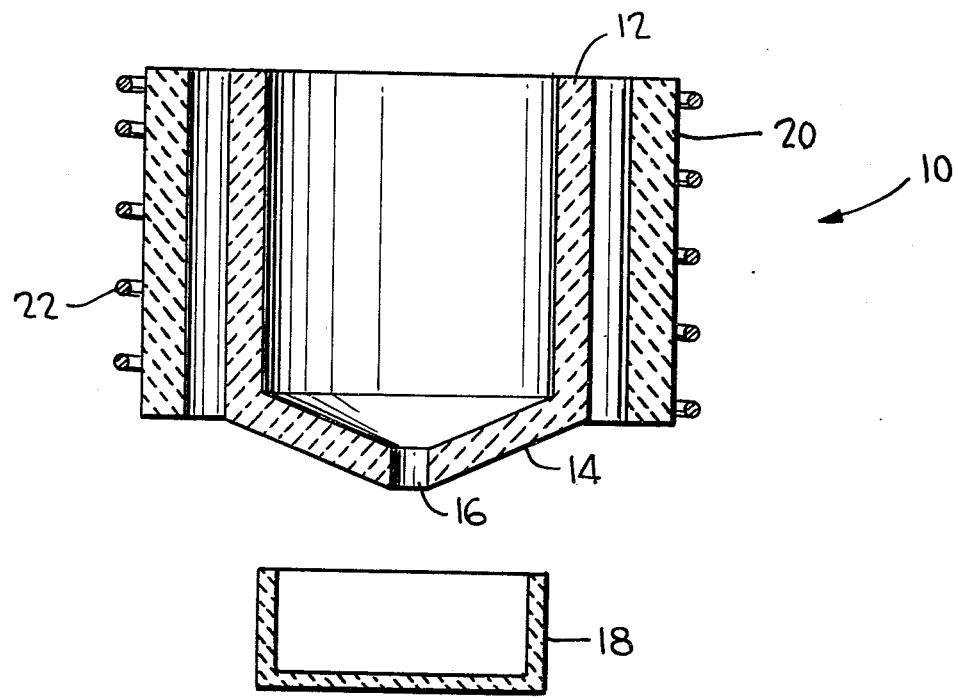

METHOD FOR THE MELTING AND SOLIDIFICATION OF SILICON

This is a continuation of application Ser. No. 916,544, filed June 19, 1978 and now abandoned.

BACKGROUND OF THE INVENTION

The present invention relates generally to a method and apparatus for the melting and casting of silicon and silicon-containing materials, and is more particularly concerned with a method and apparatus for the continuous melting of silicon for use in semiconductor devices in order to reduce the time and expense associated with conventional melting and forming.

While the present invention will be primarily discussed herein with reference to the melting of silicon for use in semiconductor type devices, particularly photovoltaic cells, it will be understood that the applicability of the present invention is not thereby so limited.

In the conventional melting and forming of silicon for semiconductor use, it generally is the practice to charge a quartz vessel with pieces of silicon of various sizes and then heat the vessel under a protective gas blanket to a temperature sufficient to melt the silicon. The silicon is then formed into a monocrystalline rod by the Czochralski method, which is to seed the molten silicon and then slowly withdraw a formed rod from the molten silicon within the vessel. This method is generally quite time-consuming and requires expensive processing equipment.

In my copending patent application Ser. No. 751,342, now U.S. Pat. No. 4,256,681, filed Dec. 16, 1976, the entirety of which is hereby incorporated by reference, a method for forming silicon into a semicrystalline product is disclosed and claimed. In that method, silicon is melted within a melting vessel and then cooled under controlled conditions to produce a semicrystalline silicon product useful for the manufacture of photovoltaic cells. This method results in distinct cost advantages over the Czochralski method for producing silicon for photovoltaic cell uses.

However, several problems are associated with the above method for producing semicrystalline silicon for use in semiconductor devices such as photovoltaic cells. One problem is that it is often difficult to control the heating of the silicon to a temperature just exceeding the melting point of silicon of 1410° C. In order to ensure that all of the silicon is melted, and because it is difficult to accurately control the heating of the vessel at such elevated temperatures, many times the silicon is heated to a temperature in excess of its melting point, e.g., the temperature of the silicon may reach 1450° C. or more. Such heating of the silicon may cause harmful stresses within the vessel used to contain the molten silicon, may cause undesirable reactions between the silicon and the vessel, and increase the time necessary for the total operation of melting and forming the silicon.

In addition, because quartz and the silicon have different coefficients of thermal contraction, upon solidification of the silicon it is a common occurrence for the vessel to crack or even break, thereby rendering the vessel unfit for further use. Quartz vessels for melting silicon are quite expensive, and as a consequence breakage of the vessels adds considerably to the overall cost of the semiconductor device made from silicon by conventional methods.

SUMMARY OF THE INVENTION

It is, therefore, an object of the present invention to provide a method and apparatus for the melting of silicon, which significantly reduces the possibility for excessively heating the silicon and its associated melting vessel.

Another object of the present invention is to provide a method and apparatus for the melting of silicon, which reduces the possibility of breakage of the melting vessel, and thereby reduces the cost of the melting operation.

Yet another object of the present invention is to provide a method and apparatus for the melting of silicon that can be performed in a continuous manner.

A further object of the present invention is to provide a method and apparatus for the melting and casting of silicon where vessels of a relatively inexpensive material can be utilized.

Briefly, the present invention in its broader aspects comprehends a method for melting silicon comprising charging a vessel with silicon, such vessel having a drain therein, heating the silicon in the vessel to a temperature above the melting point of the silicon, and allowing the molten silicon to pass through the drain out of the vessel. The invention also comprehends an apparatus adapted for use in the above method comprising a vessel having an open drain therein.

Further objects, advantages and features of the present invention will become more fully apparent from a detailed consideration of the arrangement and construction of the constituent parts as set forth in the following specification, taken together with the accompanying drawing.

BRIEF DESCRIPTION OF THE DRAWING

In the drawing, the sole FIGURE is a cross-sectional view of a vessel for containing molten silicon in accordance with the present invention.

DETAILED DESCRIPTION OF THE PREFERRED EMBODIMENTS

Referring now to the sole FIGURE of the drawing, shown is a cross-sectional view of apparatus for melting silicon containing material in accordance with the present invention. Apparatus 10 includes melting vessel 12, surrounding heat source 20 and radio frequency coils 22. Vessel 12 in this embodiment is a generally circular shape and has a sloping bottom surface 14 with an open drain 16 therein. While quartz is generally the preferred material for vessel 12, the vessel may also be composed of considerably less expensive materials such as fired clay and the like, since contamination by impurities in such vessel materials is considerably reduced by the method of the present invention as will be explained hereinafter.

Located beneath drain 16 of melting vessel 12 is receiving vessel 18 which collects molten silicon flowing from the drain. Like melting vessel 12, receiving vessel 18 may be of quartz, clay or like material.

The method of melting silicon containing material utilizing apparatus 10 includes charging pieces or chunks of silicon into the vessel 12, and then heating the vessel and the contents by coils 22. The charge silicon may be refined silicon commonly referred to as "poly", or metallurgical grade silicon having a greater amount of impurities than "poly"-type silicon. While vessel 12 is being heated, silicon containing material is protected from undersirable chemical reactions by a non-oxidizing protective gas blanket.

As the silicon containing material reaches its melting point of about 1410° C., the silicon will melt and flow down to the bottom of vessel 12 and out drain 16 into receiving vessel 18 where it is allowed to solidify slowly, e.g., in accordance with the process of my aforementioned application. The solidified body of semicrystalline silicon may then be sliced into wafers for manufacture into photovoltaic cells.

Since, in this method, the silicon flows from the vessel as soon as it melts or shortly thereafter, any tendency for the silicon to be overheated is thereby significantly reduced. A further advantage of the present method and apparatus is that as the amount of silicon in the vessel 12 is reduced due to the melted material flowing out drain 16, further material can be charged into the vessel. Also, receiving vessel 18 can be removed and replaced by another empty receiving vessel after a predetermined quantity of molten silicon has flowed into the first vessel. Thus the method and apparatus of the present invention is adapted for the sequential casting of silicon. A single melting vessel 12 may therefore be used for the melting of a volume of silicon greatly in excess of its own volume.

Moreover, since most if not all of the molten silicon will drain from vessel 12 upon completion of the casting cycle, the possibilities for vessel breakage due to solidification of silicon within the vessel during cooldown are significantly reduced if not eliminated.

As was mentioned previously, quartz type vessels are at present almost exclusively used for the conventional melting of silicon so as to minimize contamination of the material by the vessel. However, the present invention allows the use of other materials such as clay for vessel 12 since the residence time for the molten silicon is generally of a too short duration to allow significant material contamination by any impurities contained within the vessel. For similar reasons, receiver vessel 18 may also be made of other materials than quartz. Of course, the use of other materials for vessels 12 and 18 may provide significant cost reductions in the melting and casting of silicon due to the inexpensiveness of these other materials.

While there has been shown and described what is considered to be preferred embodiments of the present invention, it will be obvious to those skilled in the art that various changes and modifications may be made therein without departing from the invention as defined in the appended claims.

I claim:

1. A method for melting and solidifying silicon suitable for use as a host material for photovoltaic cells, comprising
   (a) charging solid silicon into a melting vessel having an open drain therein,
   (b) applying head to the solid silicon charge in the vessel so that initial portions thereof will be heated to a temperature above the melting point of silicon and become molten while other portions of the silicon charge remain in a solid state,
   (c) allowing the molten silicon to pass through the drain out of the melting vessel without substantial obstruction at a temperature just above the melting point of the silicon,
   (d) collecting the molten silicon in a receiving vessel at about said temperature so that the temperature of the collected silicon will be just above the melting point of silicon and the retention time of molten silicon in the melting vessel will be minimized,
   (e) gradually cooling the molten silicon mass in the receiving vessel to a temperature at its solidification point, such cooling taking place over a period of time such that the silicon forms crystal centers at generally random locations throughout the molten silicon mass,
   (f) maintaining the silicon mass at its solidification temperature for a period of time sufficient to enlarge the crystallites formed at said crystal centers until they have an average mean diameter of at least about one mm. and are generally randomly distributed in substantially non-columnar, non-linear fashion throughout the silicon mass, and
   (g) thereafter completing cooling of the silicon mass to ambient temperature to form a substantially homogeneous semicrystalline silicon body having randomly arranged silicon grains of a mean diameter of at least about one mm. at a surface thereof and adapted for use as the host material is photovoltaic cells.

2. A method as claimed in claim 1, in which the melting vessel is formed from a ceramic material.

3. A method as claimed in claim 1, in which the receiving vessel is formed from a ceramic material.

4. A method as claimed in claim 1, in which the charged silicon is metallurgical grade silicon.

5. A method as claimed in claim 1, in which the charged silicon is poly-type silicon.

6. A method as claimed in claim 1, in which the receiving vessel is rectilinear in form.

7. A method as claimed in claim 1, in which the melting vessel is maintained at substantially atmospheric pressure.

8. A method as claimed in claim 1, in which the charged silicon in the melting vessel is protected during heating by a non-oxidizing gas blanket.

9. A method as claimed in claim 1, in which a dopant is added to the silicon prior to step (e) herein.

10. A method as claimed in claim 1, in which a non-oxidizing atmosphere is maintained in the receiving vessel during cooling of the silicon.

* * * * *